United States Patent [19]

Engle

[11] Patent Number: 4,873,942
[45] Date of Patent: Oct. 17, 1989

[54] PLASMA ENHANCED CHEMICAL VAPOR DEPOSITION WAFER HOLDING FIXTURE

[75] Inventor: George M. Engle, Phoenix, Ariz.

[73] Assignee: The Stackpole Corporation

[21] Appl. No.: 204,210

[22] Filed: Jun. 8, 1988

[51] Int. Cl.$^4$ .................... C23C 16/00; C23C 14/00; B05B 5/02; B05C 5/00

[52] U.S. Cl. .................... 118/728; 156/345; 204/298; 118/50.1; 118/620

[58] Field of Search ............... 156/643, 345; 118/728, 118/50.1, 620; 427/38, 39; 204/192.1, 192.11, 192.12, 298

[56] References Cited

U.S. PATENT DOCUMENTS 4,178,877 12/1979 Kudo .................... 118/728
4,761,301 8/1988 Ellenberger et al. ........... 118/728 X

*Primary Examiner*—William A. Powell
*Attorney, Agent, or Firm*—Charles W. Helzer

[57] ABSTRACT

A holding fixture for plasma enhanced chemical vapor deposition processing of semiconductor wafers comprising a frame boat assembly for holding disk-shape semiconductor wafer workpieces to be subjected to a flow of reactant gases serially across the workpieces in a direction perpendicular to the broad faces of the workpieces. The boat holding fixture comprises a pair of upright, spaced-apart insulating frame end members having a first set of spaced-apart parallel, elongated insulating rods secured between the end members for holding the boat in assembled relation. An electrode supporting rack is secured within the boat for holding a plurality of flat, spaced-apart, electrically conductive electrodes in an upright position with the flat surfaces parallel to each other and perpendicular to the longitudinal axis of the boat. A workpiece holding rack comprised by at least two spaced-apart, parallel, insulating, workpiece support, elongated rods is provided with each workpiece support rod being seated in longitudinally aligned apertures formed on lower opposite sides of the periphery of the array of flat, spaced-apart parallel electrically conductive electrodes for holding the workpieces suspended directly from the electrodes flat against the opposite flat surfaces of the respective electrodes. The holding fixture is completed by means for applying an electric potential difference between alternate ones of the array of spaced-apart parallel electrodes.

15 Claims, 2 Drawing Sheets

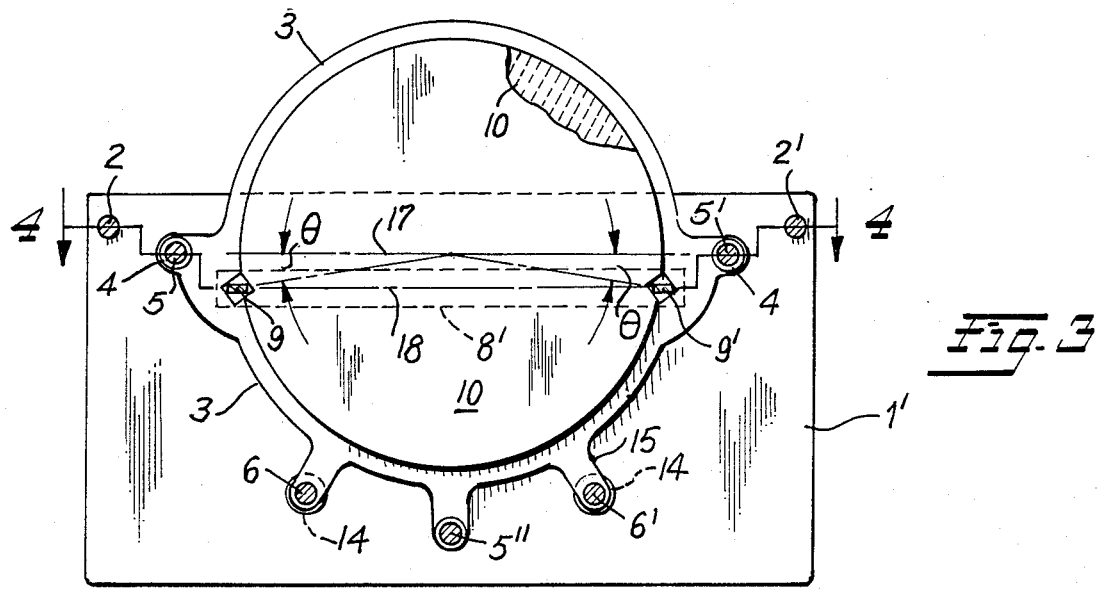
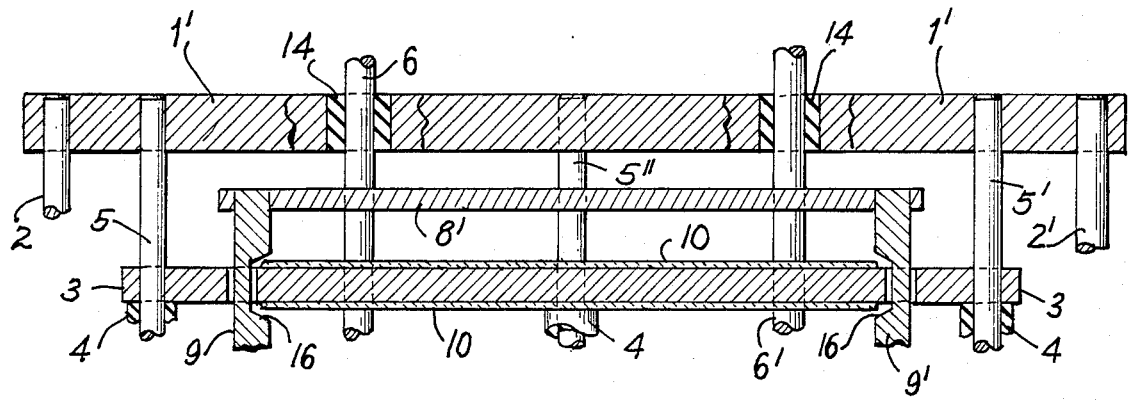

PLASMA ENHANCED CHEMICAL VAPOR DEPOSITION WAFER HOLDING FIXTURE

FIELD OF INVENTION

This invention relates to a plasma enhanced chemical vapor deposition wafer holding fixture for use in holding semiconductor wafers in a vertical, upright position with their broad flat surfaces disposed perpendicular or parallel to the flow of reactant gases serially across the workpieces in a direction perpendicular to the broad faces of the workpiece so as to achieve deposition and chemical reaction of selected gaseous vapors to form different chemical compositions on the surfaces of the wafers.

More specifically, the invention relates to a wafer holding fixture of improved design for use in the chemical processing of semiconductor wafers and which provides improved yield of acceptable grade processed wafers.

BACKGROUND OF INVENTION

U.S. Pat. No. 4,401,507—issued August 30, 1983 describes one known method and apparatus for achieving spatially uniform, externally excited, non-thermal chemical reactions in the processing of semiconductor wafers. U.S. Pat. No. 4,610,748—issued September 9, 1986 discloses and claims a prior design for a semiconductor wafer holding fixture apparatus that could be used in the wafer processing method and apparatus described in U.S. Pat. No. 4,401,507. Wafer holding fixtures of the type diclosed in U.S. Pat. No. 4,610,748 function to hold semiconductor wafers (hereinafter referred to as workpieces) onto a flat, vertical, conductive electrode formed from a highly conductive grade of graphite. It is important that the wafer holding fixture hold the workpieces as upright (vertical) as possible and flat against the confronting face of its respective supporting electrode.

Holding fixtures for semiconductor wafers have had many different configurations and designs for holding the workpieces on the electrodes, all well below the center line of the workpiece. These include holding fixtures for supporting the workpieces at the bottom of the workpiece; fixtures for supporting the workpieces on the bottom and on one side; fixtures for supporting the workpieces at different angular positions below the center line of the workpiece with the holding fixture itself trying to force the workpiece against its supporting electrode, and the like. Other prior investigated methods and structures for holding workpieces properly positioned within a serial flow of reacting gases employ moving parts. Holding fixtures employing moving parts are thought to produce particulate contamination. It further appears that such methods and devices also produce a shadow effect on the workpiece and adversely affect the within-workpiece deposition uniformity. None of these prior art approaches solved the problem of properly supporting the workpiece flat against the confronting surface of its respective supporting electrode.

Workpieces being held onto a vertical electrode may tend to lean away from the electrode due to vibration or warping or thermal expansion. If this occurs, the workpiece will not be tight against the electrode and that adversely affects the deposition uniformity of the reactant gases on the workpiece. In these arrangements, the workpiece and electrode will usually be of different materials, thus causing a mismatch of thermal expansion and complicates the holding problem. It is known that the uniformity of the deposition of the reactant gases on the workpiece in these types of deposition systems, will be affected by the spacing and the electrical contact of the workpieces to their supporting electrodes. This is a random problem which prevents obtaining desired deposition coating thicknesses and uniformities.

It is believed that the different thermal expansion rates of the supporting electrodes and the workpieces involved are the major cause of the above briefly discussed holding problems. An example is a silicon wafer workpiece being held onto a graphite electrode. The graphite's thermal expansion is greater than the silicon wafer, so that when the graphite is heated, it will grow, causing the holding fixture for the silicon wafer to move apart. When the holding fixture moves apart, the silicon wafer will drop down further into the holding fixture. Thus, after completion of the deposition and the graphite electrode and fixture cool down, the fixture will pinch the completed silicon wafer preventing its easy removal and possibly resulting in chipping or ruining the wafer.

Past efforts to solve this thermal expansion problem resulted in designing the holding fixture so that the workpieces were held at points well below the center line of the workpiece. With such an arrangement, during the cool down of the electrodes, the workpiece can cam up onto the holding fixture for easy removal and not be pinched into position. However, where the workpiece is held well below its center line, problems due to leaning and displacement of the workpiece away from the confronting face of the supporting electrode as discussed above are accentuated. To overcome these problems, the present invention was devised.

SUMMARY OF INVENTION

It is therefore a principle object of the present invention to provide a new and improved holding fixture for plasma enhanced chemical vapor deposition processing of semiconductor wafers.

A further object of the invention is to provide such a wafer holding fixture which causes the wafer being processed to be held flat against a supporting conductive electrode and which does not allow the wafer to lean away from the electrode or drop down within a wafer holding rack during processing due to different thermal expansion rates of the wafer holding rack and the conductive supporting electrodes thereby causing the processed wafers to be pinched and held following cool down of the electrode.

In practicing the invention, a holding fixture is provided for holding semiconductor wafers during plasma enhanced chemical vapor deposition processing. The holding fixture comprises a frame boat assembly for holding the disk-like wafer workpieces to be subjected to a flow of reactant gases serially across the workpieces in a direction perpendicular to the broad faces of the workpieces. The boat assembly includes in combination a pair of upright spaced-apart insulating frame end members having a first set of spaced-apart parallel, elongated insulating rods secured between the end members for holding the boat in assembled relation. An electrode holding cradle is supported within the boat for holding a plurality of flat, spaced-apart electrically conductive electrodes in an upright position within the fixture with the flat surfaces of the electrodes parallel to each other and perpendicular to the longitudinal axis of the boat. A workpiece holding rack is provided which is comprised by at least two spaced-apart, parallel insulating workpiece support elongated rods each being seated in longitudinally aligned set of apertures formed on lower, opposite peripheral side surfaces of the periphery of the respective flat, spaced-apart parallel electrically conductive electrodes below the horizontal centerline of the respective electrodes. The workpiece holding rack thus is supported directly by the electrodes and holds the workpieces flat against the opposite flat surfaces of the respective electrodes. The fixture is completed by conductive power rod means for applying an electric potential difference between alternate ones of the array of spaced-apart parallel electrodes.

In preferred embodiments of the invention, the workpieces are supported by the support rods comprising the workpiece holding rack at points around the periphery of the workpieces which form a chord parallel to the centerline of the workpiece. An angle theta ($\theta$) is formed between the centerline of the workpiece at its periphery to the point of the chord where it touches the periphery measured with respect to the centerline and is about 30 degrees or less whereby the workpieces are supported at chords which are close to the centerline of the workpiece and the workpieces are prevented from leaning away from the supporting surfaces of their respective supporting electrodes. In addition, the workpiece support rods of the workpiece holding rack have means formed on the support rods for further camming or pushing the workpiece confronting surfaces flat against the supporting surfaces of the respective electrodes.

BRIEF DESCRIPTION OF DRAWINGS

These and other objects, features and many of the attendant advantages of this invention will be appreciated more readily as the same becomes better understood from a reading of the following detailed description, when considered in connection with the accompanying drawings, wherein like parts in each of the several figures are identified by the same reference characters, and wherein:

FIG. 3 is a transverse vertical sectional view taken along line 3—3 of FIG. 1; and FIG. 4 is an enlarged, fragmentary horizonal sectional view taken along the staggered section lines 4—4 of FIG. 3.

BEST MODE OF PRACTICING INVENTION

Figure 1:
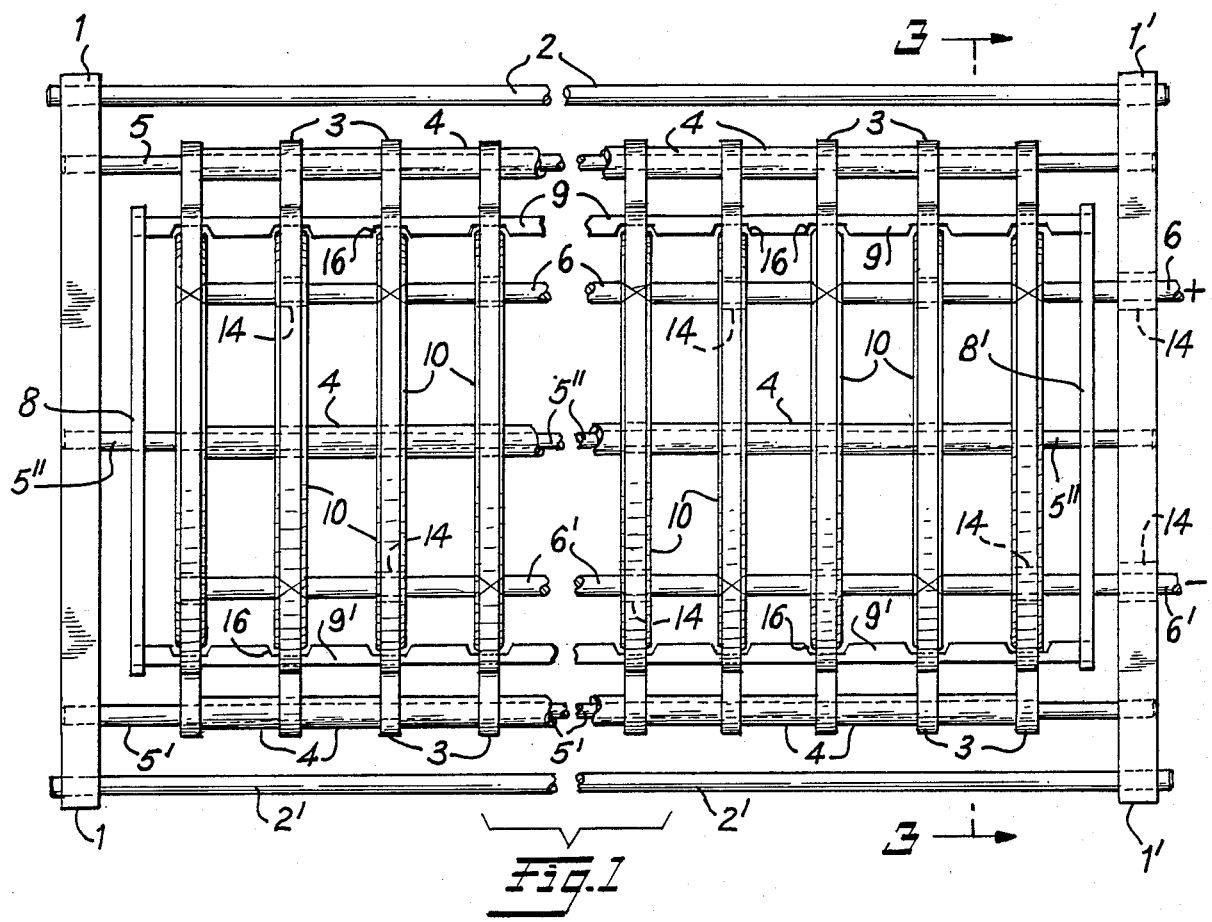
FIG. 1 is a fragmentary, top plan view of a new and improved wafer holding fixture constructed according to the present invention.
Figure 2:
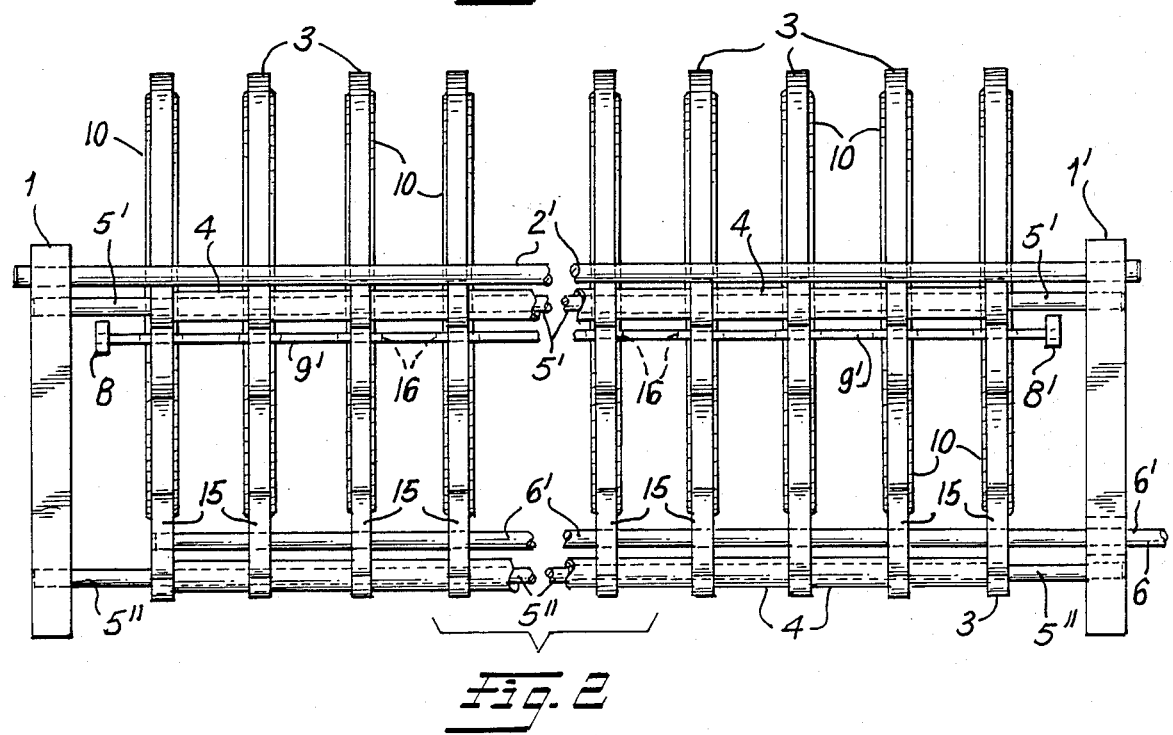
FIG. 2 is a fragmentary, side elevational view of the fixture shown in FIG. 1.

The present invention is comprised principally by the provision of an insulating workpiece holding rack for physically supporting a parallel array of disk-shaped workpieces in the form of semiconductor wafers within a holding fixture and with the flat faces of the workpieces held against confronting flat faces of a parallel array of conductive electrodes. The workpiece holding rack is supported by the array of parallel conductive electrodes so that no relative movement occurs between the workpiece holding rack (which is insulating) and the conductive electrodes due to the greater thermal expansion rate of the conductive electrodes during processing of the wafers. The manner in which this is achieved will be described more fully hereinafter with relation to the drawings.

The improved holding fixture according to the invention comprises a frame boat for holding the disk-shaped workpieces to be subjected to a flow of reactant gases serially across the workpieces in a direction perpendicular to their broad faces. For this purpose the boat assembly is comprised by a pair of insulating frame end members 1 and 1' having a first set of spaced-apart, parallel, elongated insulating rods 2 and 2' secured between the end members 1 and 1' for holding the boat in assembled relation. The end members 1 and 1' and including rods 2 and 2' may be made of ceramic, quartz, carbide or other the like insulating material.

An electrode holding cradle is supported within the end frame members 1 and 1' for holding a plurality of parallel, flat, spaced-apart electrically conductive electrodes 3 in an upright position with the flat surfaces of the electrodes parallel to each other and perpendicular to the longitudinal axis of the boat assembly. The electrode holding caradle is comprised by a set of three spaced-apart, parallel, insulating, electrode supporting elongated rods 5, 5' and 5" for holding the plurality of parallel, flat, spaced-apart, electrically conductive graphite electrodes 3 in upright position with the flat surfaces parallel to each other and perpendicular to the longitudinal axis of the boat. For this purpose, insulating spacers 4 are threaded over the respective elongated insulating electrode supporting rods 5, 5' and 5" and serve to establish the spacing between the electrodes 3 on rods 5, 5' and 5" as well as to help support the electrodes in an upright vertical position. The rods 5, 5' and 5" are fabricated from similar insulating materials to those used to form rods 2 and 2'.

As best shown in FIG. 3 of the drawings, the ends of elongated electrode support rods 5, 5' and 5" are seated within respective openings formed in each of the end frame members 1 and 1' and extend therebetween. The openings in the end frame members holding the ends of the elongated electrode support rods 5, 5' and 5" are formed in a quasi-semicircular pattern with the flat sides of the quasi-semicircular pattern facing upwardly. Hence, the set of workpiece supporting rods 5, 5' and 5" form an electrode holding cradle for holding the electrodes 3 in spaced-apart, parallel relation and electrically isolated one from the other. As best seen in FIG. 3 of the drawings, the elongated electrode supporting rods 5, 5' and 5" are secured within openings formed in small, projecting dog ears 15 that are formed around the outer periphery of the respective conductive electrodes 3. The free ends of rods 5, 5' and 5" are supported in the quasi-semicircular openings formed in the end frame members 1 and 1'. as a result of this construction, the conductive electrodes 3 are supported in mid air within the holding cardle made of rods 5, 5' and 5" which maximize flow of gaseous reactant over and around the surfaces of the electrodes and generally perpendicular to their broad faces.

The improved holding fixture further includes a workpiece holding rack comprised by at least two spaced-apart, parallel, insulating, workpiece support, elongated rods 9 and 9' which are secured together at their ends by positioning end members 8 and 8' whose longitudinal dimensions determine the widthwise spacing between the elongated workpiece support rods 9 and 9'. Rods 9 and 9' and end members 8 and 8' likewise are fabricated from insulating materials similar to those used for rods 2 and 2' and end members 1 and 1'.

As best shown in FIG. 4 of the drawings, each of the elongated workpiece supporting rods 9 and 9' comprising the workpiece holding rack are provided with notches shown at 16. Notches 16 are spaced along the length of each of the workpiece support rods 9 and 9' at points where the workpiece support rods pass through longitudinally aligned openings formed on the lower, opposite sides of the parallel array of electrically conductive electrodes 3 a slight distance below the centerline 17 of the electrodes as shown in FIG. 3. Workpieces 10 such as semiconductor wafer substrates then are supported in the workpiece holding rack comprised by members 8, 8', 9 and 9' and are held with their flat surfaces bearing against the confronting flat surface of their respective supporting conductive electrode 3. As best seen in FIG. 4, the notches 16 are provided with inwardly slanting side surfaces which, when engaged by a workpiece 10, cause the workpiece to slide or be cammed towards the confronting face of the supporting associated electrode 3. This further assures that the confronting faces of the supporting electrodes 3 and the workpieces 10 are maintained in flat, contacting relation over the entire surface of the workpiece and assists in assuring uniform action of the electric field that induces and enhances the plasma chemical deposition of the reactant gases flowing past and onto the outwardly facing flat surface of the workpieces in a substantially uniform manner.

In practicing the invention, it is important that the workpieces 10 be supported by the workpiece holding rack comprised by elongated workpiece support rods 9 and 9' at points around the periphery of each of the workpieces so as to form a chord 18 shown in FIG. 3 which is parallel to the centerline 17 of the supporting electrodes 3, and as close to it as possible. For this purpose, it is desirable that the angle theta ($\theta$) defined between a radius drawn along the centerline 17 of the electrode 3 (and hence the workpiece 10 centerline) and a radius drawn from the center of the electrode 3 (and hence the center of the workpiece 10) to the point of contact on the workpieces by the workpiece elongated support rods 9 and 9' which define the chord 18, form an angle of about 30 degrees or less. In this manner, the workpieces 10 will be supported by the workpiece support cradle as high up and close to the centerlines of the workpieces as is possible without incurring the risk of the workpieces falling away from the confronting and supporting face of its respective electrode 3. This, in conjunction with the camming action of the inwardly slanted sides of notches 16, assures that the workpieces are held flat against the broad faces of the supporting electrodes.

From the foregoing description it will be appreciated that a main feature of the invention is the mounting of the workpiece holding rack comprised by elongated rods 9 and 9' and positioning end members 8 and 8' directly on the conductive electrode members 3 so that the workpiece holding cradle will not be affected by the different thermal expansion characteristics of the conductive electrodes. Consequently, the workpiece holding rack and the positioning of the workpieces on the supporting faces of the conductive electrodes will not be greatly affected by the different thermal expansion rate of the electrode material. The cut outs or notches 16, or some other similar workpiece holding means such as workpiece supporting tabs cut from the supporting faces of the supporting electrodes as shown in FIG. 4 of the above-noted U.S. Pat. No. 4,610,748, serve to hold the workpieces up against the face of their supporting electrodes.

The positioning members 8 and 8' at each end of the workpiece holding rack are fabricated from the same material as the elongated workpiece supporting rods 9 and 9' and may be ceramic, quartz, carbide converted graphite or other similar insulating material having a thermal expansion rate less than the electrode 3. Because the workpiece holding rack comprised by these elements is an independent assembly supported from the electrodes themselves, there will be no relative movement between the workpiece supporting rack 8, 8', 9, 9' and the electrodes despite their different rates of thermal expansion. With this arrangement, the electrodes 3 may grow due to their higher thermal expansion rate, but such growth will not affect the positioning of the workpiece holding rack for the workpieces relative to the electrodes. This feature of construction allows the workpiece holding rack to be arranged as described with relation to FIG. 3 so that the centerlines of the workpieces can be held close to the centerline of the electrodes without fear of having them lean or fall away from the supporting electrode surfaces.

During plasma enhanced chemical vapor deposition processing of semiconductor wafers in the improved holding fixture assembly, different electric potentials are supplied to alternate ones of the array of spaced-apart, parallel, conductive electrodes 3. This is achieved through the use of two power rods 6 and 6' of electrically conductive material such as graphite which are led through openings in the end frame member 1' via insulating eyelets 14 which electrically isolate the power conducting rods 6 and 6' from the end frame member 1'. Power conducting rods 6 and 6' are threaded through longitudinally aligned openings in each of the electrodes 3 and are electrically connected to alternate ones of the electrodes as indicated by the x mark at the juncture of the respective power rods with the electrodes and electrically isolated from the remaining alternate electrodes by additional insulating eyelets 14. Thus, the power rod 6 is electrically connected to odd numbered electrodes commencing from the right hand side of FIG. 1 and the power rod 6' is connected to the even numbered electrodes. By this construction, different electric potentials can be applied to adjacent electrodes so as to establish a uniform plasma enhancing electric field between adjacent electrodes for the purpose explained more fully in the above-referenced U.S. Pat. No. 4,401,507.

From the above brief description, it will be appreciated that the improved workpiece holding fixture with its novel features of construction for holding the workpieces against the flat surfaces of the conductive electrodes, requires no moving parts, and reduces the complexity of the fixture while eliminating the possibility of particulate contamination. Further, the contact with the workpiece by the workpiece holding rack is reduced to a minimum thus reducing possible shadowing effect on the workpieces. A shadow, if too large, will result in reducing the deposition uniformity within the workpiece area, and if too severe can make the resulting chemically treated workpieces unusable. Since the improved holding fixture has no moving parts, it is quite reliable in operation and requires little maintenance. Further, replacement of the fixture apparatus, or parts thereof, if broken, is relatively simple and requires no especially rigorous alignment procedures or tooling to effect repairs. The basic pair of upright, spaced-apart insulating frame end members 1 and the first set of spaced-apart, parallel, elongated insulating rods 2 allows the electrodes 3 and the cradle-like electrode holding rack together with the workpiece holding rack to achieve the desired spacing simply through the use of the spacers 4 and notches 16 without encountering thermal expansion worries. The power supply rods 6 with their insulating lead-through eyelets make the application of electric potentials to alternate ones of the set of electrodes 3 simple with no thermal expansion problems encountered in these connections.

INDUSTRIAL APPLICABILITY

An improved workpiece holding fixture of simple and relatively inexpensive design and construction is provided for use by the semiconductor industry in the fabrication of semiconductor devices which employ plasma enhanced chemical vapor deposition on semiconductor wafer substrates during processing of the semiconductor devices. The improved fixture provides improved yields.

Having described one embodiment of an improved semiconductor wafer holding fixture constructed according to the invention, it is believed obvious that other modifications and variations of the invention will be suggested to those skilled in the art in the light of the above teachings. It is therefore to be understood that changes may be made in the particular embodiment of the invention described which are within the full intended scope of the invention as defined by the appended claims.

What is claimed is:

1. A holding fixture for plasma enhanced chemical vapor deposition processing of semiconductor wafer workpieces comprising a frame boat assembly for holding workpieces to be subjected to a flow of reactant gases serially across the workpieces in a direction perpendicular to the broad faces of the workpieces and to the longitudinal axis of the boat, said boat including in combination;

a pair of upright, spaced-apart insulating frame end members having a first set of spaced-apart parallel, elongated, insulating rods secured between the end members for holding the boat in assembled relation;

an electrode supporting cradle secured within the boat for holding a plurality of flat, spaced-apart, electrically conductive electrodes in an upright position with the flat surfaces parallel to each other and perpendicular to the longitudinal axis of the boat;

a workpiece holding rack comprised by at least two spaced-apart, parallel insulating workpiece support elongated rods each being seated in longitudinally aligned apertures formed on lower opposite sides of the periphery of the array of flat, spaced-apart, parallel electrically conductive electrodes for holding the workpieces flat against opposed flat surfaces of the respective electrodes; and means for applying an electric potential difference between alternate ones of the array of spaced-apart, parallel electrically conductive electrodes.

2. A holding fixture according to claim 1 wherein the workpieces are supported by the workpiece support rods at points on their periphery forming a chord parallel to the centerline of the workpiece with the angle theta ($\theta$) formed between the centerline of the workpiece and a radius to the chord at the point where it touches the periphery measured with respect to the centerline being about 30 degrees or less whereby the workpieces are supported along chords which are close to the centerline of the workpiece and the workpieces are maintained flat against the supporting surfaces of their respective supporting electrodes.

3. A holding fixture according to claim 1 further including means formed on the workpiece support rods for further securing the workpiece confronting surfaces flat against the supporting surfaces of their respective electrodes.

4. A holding fixture according to claim 2 further including means formed on the workpiece support rods for further holding the workpiece confronting surfaces flat against the supporting surfaces of the respective electrodes.

5. A holding fixture according to claim 1 wherein the workpiece support rods comprising the workpiece holding rack are spaced apart by end members secured between adjacent ends of the workpiece support rods and which determine the distance of the chord upon which the respective workpieces are supported relative to their midpoint diameter and hence how closely the workpieces are supported relative to their centerlines.

6. A holding fixture according to claim 2 wherein the workpiece support rods comprising the workpiece holding rack are spaced apart by end members secured between adjacent ends of the workpiece support rods and which determine the distance of the chord upon which the respective workpiece support rods are supported relative to their midpoint diameter and hence how closely the workpieces are supported relative to their centerlines.

7. A holding fixture according to claim 4 wherein the workpiece support rods comprising the workpiece holding rack are spaced apart by end members secured between adjacent ends of the workpiece support rods and which determine the distance of the chord upon which the respective workpieces are supported relative to their midpoint diameter and hence how closely the workpieces are supported relative to their centerlines.

8. A holding fixture according to claim 3 wherein the means formed on the workpiece support rods for further securing the workpiece confronting surfaces flat against the supporting surfaces of the respective electrodes comprise notches formed in the peripheral surfaces of the supporting rods with the notches having inwardly slanting side edges at the points along the axial length of the workpiece support rods where the workpieces are supported whereby the confronting surface areas of each workpiece below its centerline is physically cammed by the inwardly slanting side edges of the notches into contact with the confronting surface of its respective supporting electrode.

9. A holding fixture according to claim 4 wherein the means formed on the workpiece support rods for further securing the workpiece confronting surfaces flat against the supporting surfaces of the respective electrodes comprise notches formed in the peripheral surface of the supporting rods with the notches having inwardly slanting side edges at the points along the axial length of the workpiece support rods where the workpieces are supported whereby the confronting surface areas of each workpiece below its centerline is physically cammed by the inwardly slanting side edges of the notches into contact with the confronting surface of its respective supporting electrode.

10. A holding fixture according to claim 7 wherein the means formed on the workpiece suport rods for further securing the workpiece confronting surfaces flat against the supporting surfaces of the respective electrodes comprise notches formed in the peripheral surfaces of the supporting rods with the notches having inwardly slanting side edges at the points along the axial length of the workpiece support rods where the workpieces are supported whereby the confronting surface areas of each workpiece below its centerline is physcially cammed by the inwardly slanting side edges of the notches into contact with the confronting surface of its respective supporting electrode.

11. A holding fixture according to claim 1 wherein the electrode supporting cradle comprises a second set of elongated insulating electrode supporting rods seated within openings formed in each of the end frame members and extending therebetween and with the openings being formed in the end frame members in quasi-semicircular patterns with the flat sides of the quasi-semicircular patterns facing upwardly whereby the second set of electrode supporting rods form an electrode supporting cradle for holding the electrodes in spaced-apart parallel relationship, electrically isolated one from the other and with their broad surfaces at right angles to the longitudinal axis of the holding fixture.

12. A holding fixture according to claim 10 wherein the electrode supporting cradle comprises a second set of elongated insulating electrode supporting rods seated within openings formed in each of the end frame members and extending therebetween and with the openings being formed in the end frame members in quasi-semicircular patterns with the flat sides of the quasi-semicircular patterns facing upwardly whereby the second set of electrode supporting rods form an electrode holding cradle for holding the electrodes in spaced-apart parallel relationship, electrically isolated one from the other and with their broad surfaces at right angles to the longitudinal axis of the holding fixture.

13. A holding fixture according to claim 12 further including electrically insulating spacers secured on the respective electrode supporting rods for equally spacing apart the electrode supported thereon and electrically isolating each electrode from the others.

14. A holding fixture according to claim 1 wherein the means for applying an electric potential difference between alternate ones of the array of spaced-apart parallel electrodes is comprised by a set of conductive rods insulatingly supported between the frame members with each rod extending through respective sets of axially aligned holes in the parallel array of conductive electrodes and with one of the condutive rods of the set being electrically connected to alternate ones of the array of conductive electrodes and the remaining conductive rod being electrically connected to the ramining alternate ones of the conductive electrodes.

15. A holding fixture according to claim 14 wherein the means for applying an electric potential difference between alternate ones of the array of spaced-apart parallel electrodes is comprised by a set of conductive rods insulatingly supported between the frame members with each rod extending through respective sets of axially aligned holes in the parallel array of conductive electrodes and with one of the conductive rods of the set being electrically connected to alternate ones of the array of conductive electrodes and the remaining conductive rod being electrically connected to the remaining alternate ones of the conductive electrodes.

* * * * *